United States Patent [19]

Kobayashi et al.

[11] Patent Number: 4,914,400
[45] Date of Patent: Apr. 3, 1990

[54] DIFFERENTIAL AMPLIFIER CIRCUIT IMPROVED TO SHORTEN A CIRCUIT RECOVERY TIME THEREOF

[75] Inventors: Osamu Kobayashi, Yokohama; Kunihiko Gotoh, Kunitachi, both of Japan

[73] Assignee: Fujitsu Limited, Kawasaki, Japan

[21] Appl. No.: 325,032

[22] Filed: Mar. 16, 1989

Related U.S. Application Data

[63] Continuation of Ser. No. 77,299, Jul. 24, 1987, abandoned.

[30] Foreign Application Priority Data

Jul. 24, 1986 [JP] Japan .................................. 61-174657

[51] Int. Cl.$^4$ ............................................. H03F 3/45
[52] U.S. Cl. ..................................... 330/252; 330/253
[58] Field of Search ....................... 330/252, 253, 257; 307/355, 356, 300

[56] References Cited

FOREIGN PATENT DOCUMENTS 18009  1/1985  Japan .................................. 330/252

Primary Examiner—James B. Mullins
Attorney, Agent, or Firm—Staas & Halsey

[57] ABSTRACT

A differential amplifier circuit whereby recovery time produced by a large amplitude of a voltage difference appearing between differential input signals fed to an input stage of the differential amplifier circuit is shortened by adding two transistors. The two added transistors are connected to nodes where two transistors of the differential input stage are connected to two loads of the differential input stage respectively. One of the two added transistors directly contributes to shorten the recovery time by reducing a voltage at one of the nodes from which an output signal voltage of the differential amplifier circuit is obtained. The other of the two added transistors is for obtaining a symmetric property of the differential amplifier circuit.

11 Claims, 4 Drawing Sheets

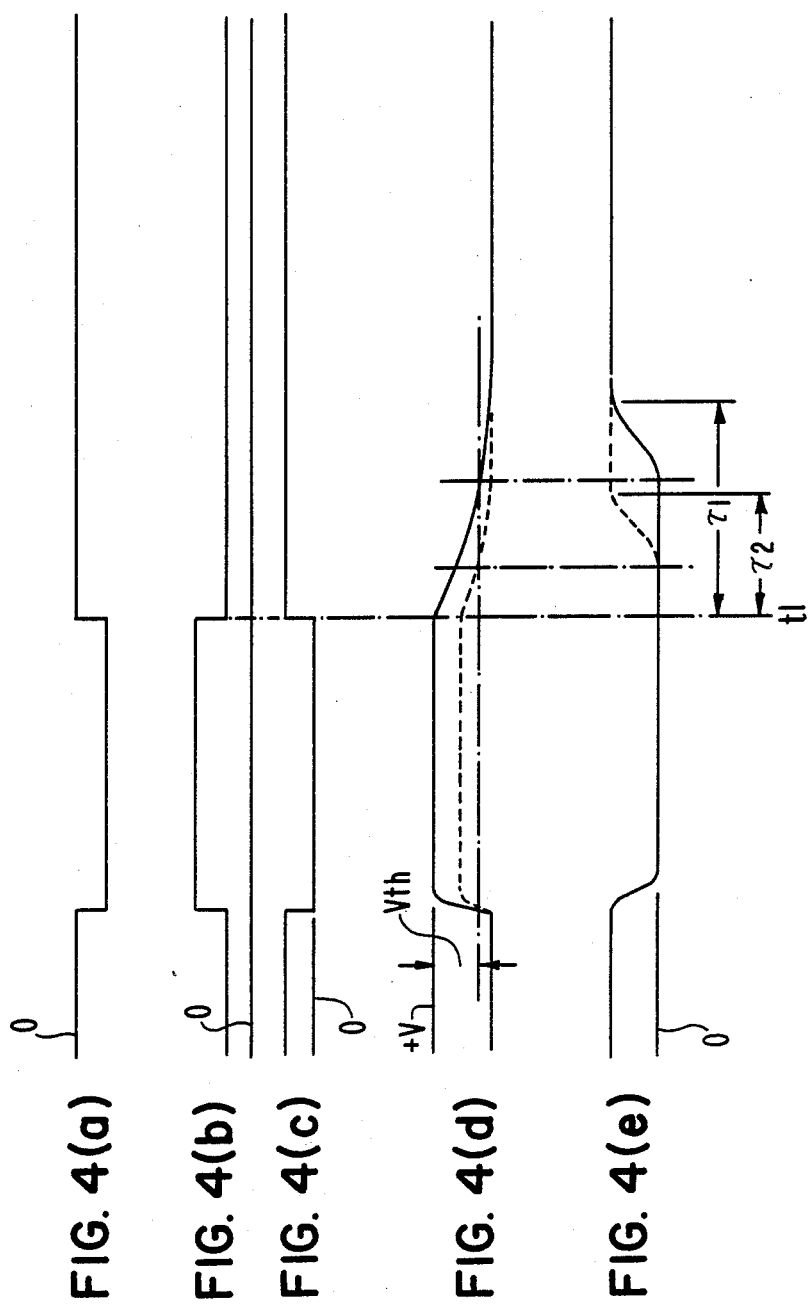

DIFFERENTIAL AMPLIFIER CIRCUIT IMPROVED TO SHORTEN A CIRCUIT RECOVERY TIME THEREOF

This is a continuation of co-pending application Ser. No. 077,299, filed on July 24, 1987, now abandoned.

BACKGROUND OF THE INVENTION

The present invention relates to a differential amplifier circuit (DIFF-AMP circuit) having an improving circuit to shorten a circuit recovery time of the DIFF-AMP circuit when the amplitude of an input signal of the DIFF-AMP circuit exceeds a linear operating region.

Generally, when the amplitude of an input signal to a DIFF-AMP circuit is too large, the DIFF-AMP circuit is driven into a saturation region of operation. An initial state of the DIFF-AMP circuit is thereby changed to a second state (saturation state) in which the DIFF-AMP circuit cannot be used normally to produce a normal output having a sufficient amplitude until the DIFF-AMP returns from the second state back to the initial state. The time in which the DIFF-AMP circuit returns from the second state back to the initial state will be called circuit recovery time hereinafter. The circuit recovery time depends on an amplitude of the input signal; that is, the circuit recovery time is lengthened when the input amplitude is large.

Therefore, when a DIFF-AMP circuit is used in an integrated circuit (IC) device such as an operational amplifier or a comparator and the amplitude of a differential input signal to the DIFF-AMP circuit exceeds a liner operating region of the DIFF-AMP circuit, a circuit recovery time of the DIFF-AMP circuit is lengthened and it is driven into the second state. This second state continues until the recovery time is over even though an amplitude of a differential input signal successively fed to the DIFF-AMP circuit is so sufficiently small that the DIFF-AMP circuit would otherwise operate within a normal linear region.

FIG. 1 shows an operational amplifier including a conventional DIFF-AMP circuit. In FIG. 1, differential input signals S1 and S2 are fed to the gates of n channel (n-ch) type metal oxide semiconductor (MOS) transistors T1 and T2 through the input terminals −In and +In respectively; wherein, the MOS transistors T1 and T2 form a differential input stage and the input signals S1 and S2 are an inverting input signal and a non-inverting input signal respectively. The drain electrodes of the MOS transistors T1 and T2 are directly connected to the drain electrodes of p channel (p-ch) transistors T3 and T4 through nodes N1 and N2 respectively. The transistors T3 and T4 are loads of the transistors T1 and T2 respectively and form a current mirror circuit. The node N2 is connected to the gate of a p-ch MOS transistor T5 which is an output stage of the operational amplifier. Reference symbols J1 and J2 are constant current sources respectively, +V and −V are a plus power supply voltage and a minus power supply voltage respectively and OUT is an output terminal of the operational amplifier.

In FIG. 1, when the voltage difference between differential input signals S1 and S2 increases a T1 current which flows through the transistor T1 increases. A current ratio, which will be called a first current ratio hereinafter, of T1 current to a T2 current which flows through the transistor T2 increases, because the source electrodes of transistors T1 and T2 are connected in common with the constant current source J1. Then, a current ratio of a T3 current, which flows through the transistor T3, to a T4 current, which flows through the transistor T4, must be equal to the first current ratio because transistors T3 and T4 are the loads of transistors T1 and T2 respectively. However, since the transistors T3 and T4 form the current mirror circuit, the T4 current tends to be equal to the T3 current. Therefore, a potential at the node N2 rises up to almost the power supply voltage +V, so that the transistor T5 is forced to be completely cut off.

After the input differential signals S1 and S2 having the large voltage difference are over, the risen potential at the gate of the transistor T5 decreases. However, this decrease takes time (recovery time) until a current starts to flow through the transistor T5 because it takes a time to allow the charged stray capacitance around the node 2 and the gate of the transistor T5 due to the risen potential to discharge. The recovery time continues even though succeeding differential input signals S1 and S2 have normal amplitude, such that a voltage difference between the succeeding differential input signals is in the operating region of the operational amplifier. The differential input signals S1 and S2 are pulse signals having a repetition rate. Therefore, if the recovery time is lengthened, the repetition rate must be decreased resulting in a decrease of operational speed of the operational amplifier. This has been a problem (a first problem) in DIFF-AMP circuits.

The first problem has been solved by applying diode clampers to the DIFF-AMP circuit. This has been disclosed in a technical paper "A Two Chip PCM Voice CODEC with Filters", by Y. A. HAQUE et al, in the IEEE JOURNAL OF SOLID-STATE CIRCUITS, VOL. SC-14, NO. 6, DECEMBER 1979.

FIG. 2 shows a circuit diagram of a DIFF-AMP circuit including diode clampers. This circuit is called "a diode clamped preamplifier" according to the IEEE paper and the circuit diagram is a part of a circuit diagram (FIG. 5 in the paper) for "a comparator" which is discussed in paragraph D on page 964 of the paper. The paper says that "the output of a non diode clamped differential stage undergoes large voltage excursions and under sufficient input voltage it drives the output devices out of the saturation region of operation. Therefore, in switching from one state to another, the comparator initially starts with a low gain resulting in a slow response time. Diode clamps on the output nodes (node 2) limits the voltage excursion of the output nodes and thus improves the transient response."

In FIG. 2, transistors Q14 and Q15 correspond to the transistors T1 and T2 of FIG. 1; transistors Q16 and Q17 correspond to the transistors T3 and T4 of FIG. 1 and form a current mirror circuit; nodes 1 and 2 correspond to the nodes N1 and N2 of FIG. 1 transistor Q13 corresponds to the constant current source J1 in FIG. 1. A combination of transistors Q18 and Q19, and that of Q20 and Q21 respectively form source followers each corresponding to the output stage T5 in FIG. 1. When the transistors Q14 and Q15 receive differential input signals "(+)" and "(−)" respectively and a current ratio of a current flowing through the transistor Q14 to a current flowing through the transistor Q15 increases, the potential at the node 2 tends to rise up to a power supply voltage +V. However, since a diode D2 is connected between the nodes 1 and 2, the potential at the node 2 can be kept to a forward voltage drop, which is approximately 0.6 V to 0.8 V higher than the potential at the node 1. A diode D1 acts the same as the diode D2 when a current ratio of the current flowing through the transistor Q15 to the current flowing through the transistor Q14 increases. Because of thus using the diodes D1 and D2 to the DIFF-AMP circuit, the voltage excursion of the nodes 1 and 2 can be limited and the transient response in the DIFF-AMP circuit can be improved.

However, the circuit still has a problem (a second problem) as follows:

(1) generally, diodes are hard to fabricate with complementary MOS (CMOS) transistors in an IC device because of a latch-up problem;

(2) therefore, if an IC device including the CMOS transistors is forced to be fabricated with diodes, the reliability of the IC device would be reduced and the cost of the IC device would be increased; and (3) since a forward voltage drop of each clamping diode D1 or D2 is fixed, for example, from 0.6 V to 0.8 V in a case of a silicon diode, the voltages at the output nodes 1 and 2 of the DIFF-AMP circuit become uncontrollable, which causes the following problems:

first, the designing freedom of an IC device including the DIFF-AMP circuit having the clamping diodes is restricted; and second, an operation speed of the DIFF-AMP circuit cannot be expected to be high, because, generally, a threshold voltage ($V_{th}$) of an output stage of a DIFF-AMP circuit is set low for increasing the operation speed of the DIFF-AMP circuit; however, the $V_{th}$ cannot be decreased so low as long as the clamping diode (D2) is used in the DIFF-AMP circuit, because the $V_{th}$ must be always set above the summation of the diode (D2) forward voltage drop and the voltage at the node 1 for making the clamping function of the diode (D2) occur. In other words, the $V_{th}$ cannot be reduced below the summed voltage of the diode forward voltage drop and the voltage at the node 1.

SUMMARY OF THE INVENTION

An object of the present invention is to reduce the recovery time of a differential amplifier (DIFF-AMP) circuit when an amplitude of differential input signals and a voltage difference between the differential input signals are so large that the DIFF-AMP circuit is forced to operate in a saturation region.

Another object of the present invention is to increase an operation speed of the DIFF-AMP circuit.

Still another object of the present invention is to make the recovery time of the DIFF-AMP circuit controllable in cooperation with an amplitude degree of the DIFF-AMP circuit.

A further object of the present invention is to make a fabrication process of the DIFF-AMP circuit simple.

Still a further object of the present invention is to increase reliability of the DIFF-AMP circuit.

Yet another object of the present invention is to reduce fabrication costs of the DIFF-AMP circuit.

The above and other objects of the present invention are achieved by applying an improving circuit consisting of two transistors, to the DIFF-AMP circuit. The DIFF-AMP circuit comprises a differential input stage formed by two transistors, and a current mirror circuit, formed by another two transistors, as a load of the differential input stage; wherein, the two transistors of the differential input stage and the other two transistors of the current mirror circuit are connected at nodes (N1 and N2). When differential input signals fed to the differential input stage have a large amplitude and a voltage difference between the differential input signals is large, currents flowing through the two transistors of the differential input stage become unbalanced. At least one of the two transistors is forced to be cut off resulting in an increasing voltage at a node (for example, the node N2) up to a power supply voltage (for example, a plus power supply voltage +V). Therefore, when the node (N2) is connected to an output transistor of an output stage of a circuit including the DIFF-AMP circuit, for example an operational amplifier circuit or a comparator of the IC device, the increased voltage at the node (N2) acts to cut off the current flowing through the output transistor. In the existing art, the increased voltage at the node (N2) does not decrease even though the differential input signals are no longer present, because the stray capacitance existing around the node (N2) and an input terminal of the output transistor discharges but taking a time, called the recovery time, until the current of the output transistor starts to flow again. However, in the present invention two transistors are connected to the nodes (N1 and N2) so that the risen voltage at one node (N2), connected with the output transistor, decreases, so that a proper current can be allowed to flow through the output transistor even during the differential input signals are while applied to the differential input stage. As a result, the recovery time of the DIFF-AMP circuit can be shortened, which results in increasing an operation speed of the DIFF-AMP circuit. By connecting a transistor to the node (N2) instead of a connecting diode, the voltage at the node (N2) can be controlled. The voltage at the node (N2) can therefore be set lower than a voltage obtained by applying the diode resulting in more decreasing of the recovery time. In addition, the recovery time can be adjusted properly so as not to reduce the gain of the DIFF-AMP circuit too low. This gives freedom to a design of an IC device including the DIFF-AMP circuit. When MOS transistors are used in the improved circuit, the fabrication process of the DIFF-AMP circuit becomes easy and simple, which results in increasing the reliability of an IC device including the DIFF-AMP circuit and decreasing the fabrication costs of the IC device.

BRIEF DESCRIPTION OF THE DRAWINGS

FIGS. 4(a)–4(e) are waveform diagrams to show voltages and currents related to the recovery time produced in a DIFF-AMP circuit;

DESCRIPTION OF THE PREFERRED EMBODIMENTS

Figure 3:
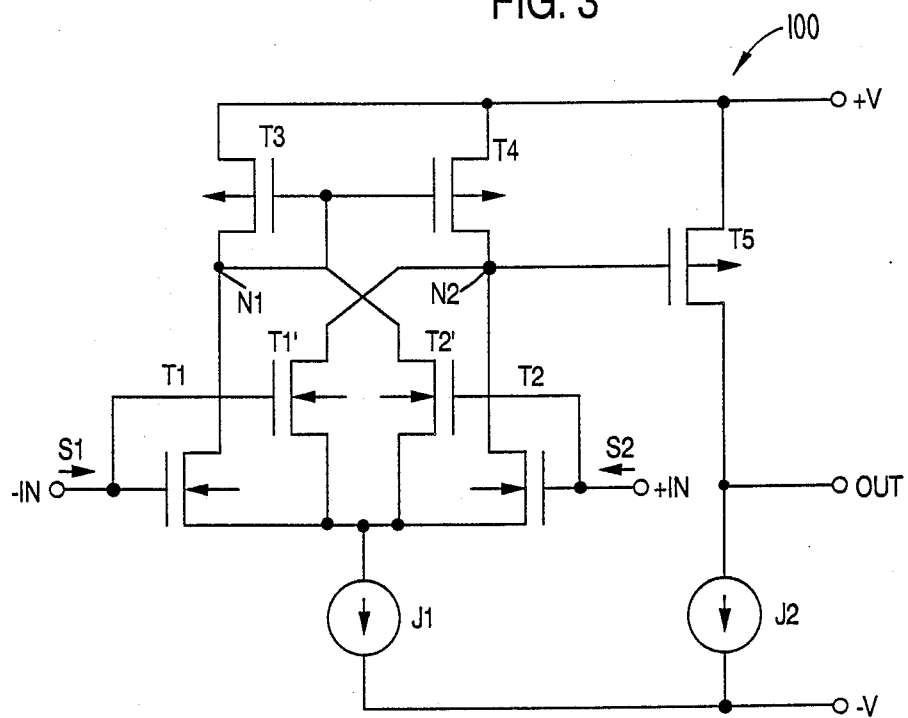
FIG. 3 is a circuit diagram of an operational amplifier comprising a first DIFF-AMP circuit, using MOS transistors, firstly embodying the present invention.

FIG. 3 shows an operational amplifier (a first operational amplifier) 100 using a DIFF-AMP circuit (a first DIFF-AMP circuit) of a first embodiment of the present invention.

Figure 1:
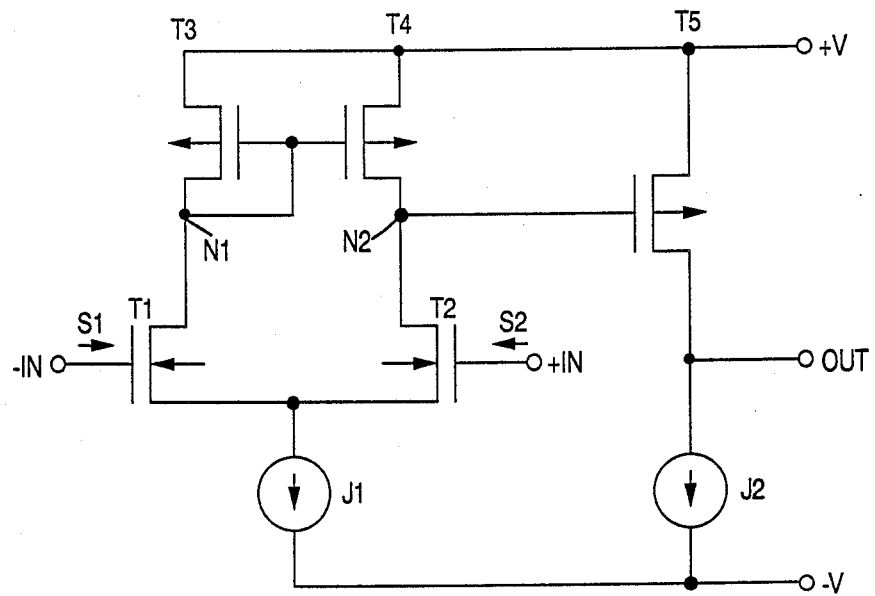
FIG. 1 is a circuit diagram of an existing operational amplifier comprising a first DIFF-AMP circuit.

In FIG. 3, each part with the same reference symbol or numeral as in FIG. 1 has the same function. Differential input signals S1 and S2 are fed to n-ch MOS transistors T1 and T2, which form a differential input stage, through input terminals −In and +In respectively. The MOS transistors T1 and T2 are connected to p-ch MOS transistors T3 and T4 at nodes N1 and N2 respectively. The MOS transistors T3 and T4 are the loads of the MOS transistors T1 and T2 and form a current mirror circuit. The node N2 is connected to the gate of a p-ch MOS transistor T5 which is an output stage of the first operational amplifier. Reference numerals J1 and J2 are constant current sources respectively, +V and −V are a plus and a minus power supply voltage respectively, and OUT is an output terminal of the first operational amplifier.

The first DIFF-AMP circuit of the first embodiment can be constructed by adding n-ch MOS transistors T1' and T2' to the prior art DIFF-AMP circuit. In FIG. 3, the source electrodes of the transistors T1' and T2' are connected in common with the constant current sources J1; the gate electrodes of the transistors T1 and T1' are connected in common with the input terminal −In and those of the transistors T2 and T2' are connected in common with the input terminal +In; and the drain electrodes of T1' and T2' are connected with the nodes N2 and N1 respectively.

When the differential input signals S1 and S2 have a normal amplitude, the first DIFF-AMP circuit outputs normal output signals from the output terminal OUT, corresponding to the input signals S1 and S2 respectively. However, when the signals S1 and S2 have a large amplitude respectively and there is a large voltage difference between them, the currents flowing through the transistors T1 and T2 become unbalanced so that, for example, the currents respectively flowing through T2 and T2' are cut off. In the prior art, when the current flowing through the transistor T2 is cut off, the voltage at the node N2 rises up to the power supply voltage +V as stated referring to FIG. 1. However, in the first embodiment, when the currents flowing through the transistor T2 and T2' are cut off, a voltage at the node N2 does not rise so high as that the voltage rises up to the power supply voltage +V because of the transistor T1'. That is, since the transistor T1' is added to the first DIFF-AMP circuit, the extreme rise of the voltage at the node 2 can be limited, resulting in shortening the recovery time of the first DIFF-AMP circuit.

A transistor T2' is also added to the first DIFF-AMP circuit similarly to the transistor T1'; however, the transistor T2' is added for obtaining a symmetric property of the first DIFF-AMP circuit having the mirror circuit of the transistors T3 and T4. That is, when the voltages at the gates of the differential input stage are equal to each other in the operation of the DIFF-AMP circuit, the transistor T2' operates so that an incoming current (the currents of the transistors T1' and T2) and an outgoing current (a current of transistor T4) at the node N2 are maintained equally in cooperation with the operation of the transistor T1'.

Because of providing the transistor T2' to the first DIFF-AMP circuit thus, even though the voltage difference between the differential input signals S1 and S2 is large, a ratio of a T3 current, which is a current flowing through the transistor T3 and so forth, to a T4 current does not exceed a ratio of a T1 current to a T1' current or of a T2 current to a T2' current. When the ratios of the T1 current to the T1' current and of the T2 current to the T2' current are made small, the recovery time can be shortened. However, if the current ratios were made equal to one respectively, the DIFF-AMP circuit could not have a gain as an amplifier. Therefore, it is necessary to set the transistor T1' current smaller than the transistor T1 current and to set the transistor T2' current smaller than the transistor T2 current. Actually, the ratio of the T1' current to the T1 current or the T2' current to the T2 current is set approximately from one tenth to one fifth. In other words, a ratio of mutual conductance of the transistor T1' to that of the transistor T1 or mutual conductance of transistor T2' to that of the transistor T2 is set approximately from one tenth to one fifth.

Because of adding the transistors T1' and T2', the recovery time can be shortened; however, the gain of the first DIFF-AMP circuit is reduced. However, the recovery time and the gain can be controlled properly so that the former is shortened sufficiently and the latter is not reduced so much, by selecting the sizes of the transistors T1, T1', T2 and T2' respectively when the first DIFF-AMP circuit is fabricated.

FIGS. 4(a), 4(b), 4(c), 4(d) and 4(e) show wave forms of voltages and currents relating to the recovery time of the first DIFF-AMP circuit. These figures are for discussing the effect of the present invention, and for comparing with the existing art. FIG. 4(a) shows the voltage difference between the input differential singals S1 and S2. FIGS. 4(b) and 4(c) show the currents flowing through the transistor T1 and T2 respectively, corresponding to the differential input signals S1 and S2. FIG. 4(d) shows the voltage at the node N2 or at the gate of the transistor T5, and FIG. 4(e) shows the current flowing through the transistor T5.

When the differential input signals S1 and S2 are over at time t1, there is no voltage difference ($S1-S2=0$) as shown in FIG. 4(a) and no current flows through the transistor T1 and T2 as shown in FIGS. 4(b) and 4(c) respectively. However, the voltage at the gate of the transistor T5 rises up to approximately the power supply voltage +V at time t1 as shown in FIG. 4(d), and it takes a time (recovery time) until the gate voltage decreases so that a current starts to flow through the transistor T5 as shown in FIG. 4(e).

In FIG. 4(d), a recovery time $\tau1$ is necessary in the case of the existing art as shown by a solid line; however, the recovery time $\tau1$ is shortened to $\tau2$ in the case of the present invention as shown by a dotted line; wherein, a reference symbol $V_{th}$, shown in FIG. 4(d), indicates the threshold voltage of the transistor T5. As shown in FIG. 4(e), the current flowing through the transistor T5 starts to flow after the recovery time $\tau1$ from time t1 in the case of the existing art; however, in the case of the present invention, the recovery time $\tau1$ is shortened to $\tau2$. Usually, the recovery time is in the order of micro second and a ratio of $\tau2$ to $\tau1$ is set from 0.4 to 0.7.

Figure 2:
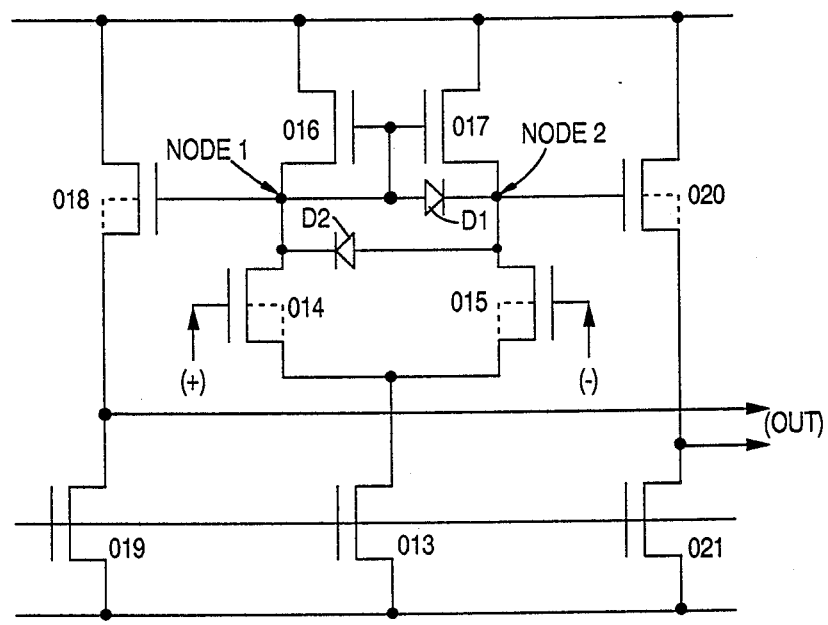
FIG. 2 is a circuit diagram of an existing operational amplifier comprising a second DIFF-AMP circuit, including diode clampers.

Because of thus using a transistor (T1') for reducing the voltage at an output node (N2) of the DIFF-AMP circuit, the voltage at the output node can be controlled freely. This contributes to give a freedom to design of the DIFF-AMP circuit and to perform a high operation speed of the DIFF-AMP circuit, compared with the prior art which has been stated referring to FIG. 2.

Figure 5:
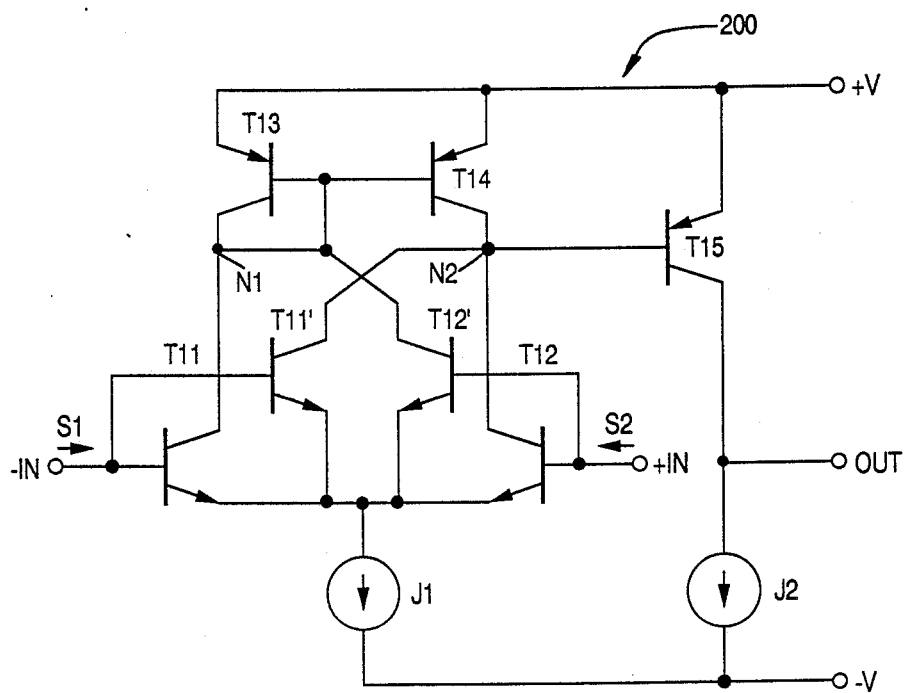
FIG. 5 is a circuit diagram of an operational amplifier comprising a second DIFF-AMP circuit, using bipolar transistors, secondly embodying the present invention.

The present invention is not limited to the above first embodiment, and numerous modifications and changes can be performed. For example, FIG. 5 shows a second operational amplifier 200 including a second DIFF-AMP circuit of a second embodiment of the present invention. In FIG. 5, each part with the same reference symbol or numeral as in FIG. 3 has the same function, and p-n-p bipolar transistors T13, T14 and T15 are used instead of the p-ch MOS transistors T3, T4 and T5 in FIG. 3 respectively and n-p-n bipolar transistors T11, T11', T12 and T12' are provided instead of the n-ch MOS transistors T1, T1', T2 and T2' in FIG. 3 respectively. That is, in the second embodiment, the bipolar transistors are connected as follows. The transistor T11 and T12 form a differential input stage, then the differential input signals S1 and S2 are respectively fed to their base electrodes through the input terminals −In and +In respectively. The transistors T13 and T14 are loads of the transistors T11 and T12 respectively, forming a current mirror circuit. The collector electrodes of the transistors T11 and T12 are connected with the collector electrodes of the transistor T13 and T14 respectively through the nodes N1 and N2 respectively. The node N2 is connected with the base electrode of the transistor T15. The transistor T11' is added to the second DIFF-AMP circuit for avoiding a voltage at the node N2 (at the gate electrode of the transistor T15) from rising up to approximately the power supply voltage +V when a voltage difference between the differential input signals S1 and S2 is large. The collector electrode of the transistor T11' with the node N2, the base electrode of the transistor T11' is connected with the input terminal −In, and the emitter electrode of the transistor T11' is connected to the constant current source J1. The transistor T12' is also added to the second DIFF-AMP circuit for obtaining a symmetric property of the second DIFF-AMP circuit having the mirror circuit of the transistors T13 and T14. The collector electrode of the transistor T12' is connected with the node N1, the base electrode of the transistor T12' is connected with the input terminal +In, and the emitter electrode of the transistor T12' is connected with the constant current source J1. The function of the transistors T11' and T12' are equal to the first embodiment stated referring to FIG. 3.

As stated in the above embodiments, each load for the transistors T1 and T2 in FIG. 3 or each load for the transistors T11 and T12 in FIG. 5 is made by a transistor (load transistor). However, a resistance means can be applied instead of the load transistor, and furthermore the load for the transistor T1 or T11 can be substantially omitted as shown in FIG. 6.

Figure 6:
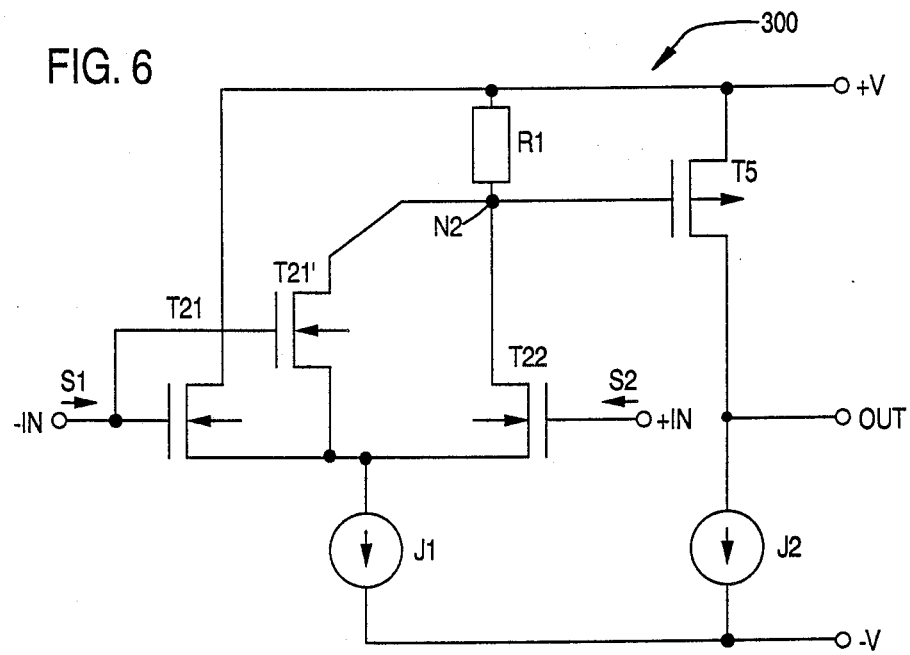
FIG. 6 is a circuit diagram of an operational amplifier comprising a DIFF-AMP circuit thirdly embodying the present invention.

FIG. 6 shows an operational amplifier 300 comprising a DIFF-AMP circuit thirdly embodying the present invention. In FIG. 6, the same reference symbols as in FIG. 3 designate the same elements as in FIG. 3, transistors T21 and T22 form a differential input stage, a transistor T21' operates for reducing the voltage at the node N2 as stated in FIG. 3 and a resistance means R1, which can be formed by using field effect transistor for example, is a load for the transistor T22.

Figure 7:
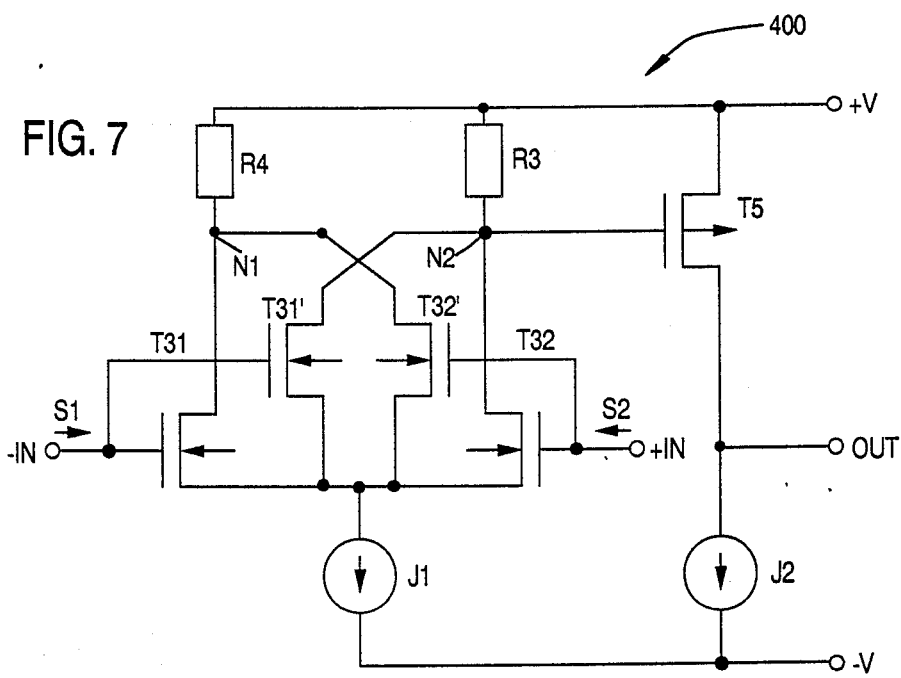
FIG. 7 is a circuit diagram of an operational amplifier comprising a DIFF-AMP circuit fourthly embodying the present invention.

FIG. 7 shows an operational amplifier 400 comprising a DIFF-AMP circuit fourthly embodying the present invention. In FIG. 7, the same reference symbols as in FIG. 3 designate the same elements as in FIG. 3, and transistors T31 and T32 form a differential input stage, a transistor T31' operates for reducing the voltage at the node N2, a transistor T32' operates for making a symmetric property of the DIFF-AMP circuit as stated in the explanation of the transistor T2' in FIG. 3, and resistance means R3 and R4, each also can be made by a field effect transistor, are the loads for the transistors T31 and T32 respectively.

Figure 8:
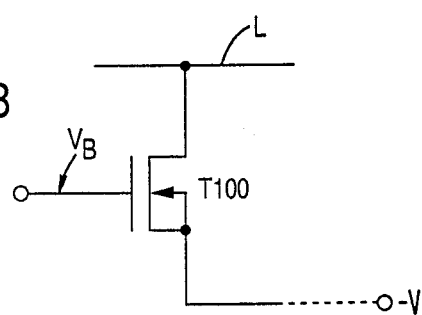
FIG. 8 is a circuit diagram of a constant current source, comprising a transistor, used in a DIFF-AMP circuit.

In the above embodiments, the constant current source J1 or J2 can be made by a transistor (T100) as shown in FIG. 8. In FIG. 8, the same reference symbols as in FIG. 3 designate the same elements as in FIG. 3. The source electrodes of the transistors of the differential input stage and of other added transistors in the circuit of each embodiment, such as the transistors T1, T2, T1' and T2' in FIG. 3, are connected in common with a line L, and a potential at a control electrode (gate electrode) of the transistor T100 is fixed by a voltage $V_B$.

In the above embodiments, the DIFF-AMP circuit is used in the operational amplifiers; however, the DIFF-AMP circuit can be used also in a comparator. A circuit diagram of a comparator is equal to that of the operational amplifier.

What is claimed is:

1. A differential amplifier circuit operatively connectable to receive first and second power supply voltages and to receive differential input signals, and for producing an output signal in response to receiving said differential input signals, said differential amplifier circuit comprising:

first input terminal means for receiving a first one of said differential input signals;

second input terminal means for receiving a second one of said differential input signals;

output terminal means for providing said output signal;

first transistor means of a first conductivity type, having a first mutual conductance and having a control electrode operatively connected to said first input terminal means for controlling said first transistor means in accordance with receiving the first one of said differential input signals, said first transistor means having a first electrode operatively connected to receive said first power supply voltage, and having a second electrode;

second transistor means of the first conductivity type, having a second mutual conductance and having a control electrode operatively connected to said second input terminal means for controlling said second transistor means in accordance with receiving the second one of said differential input signals, said second transistor means having a first electrode operatively connected to said output terminal means and having a second electrode operatively connected to the second electrode of said first transistor means;

a first load element operatively connectable to receive said first power supply voltage and operatively connected to the first electrode of said second transistor means;

an output voltage amplifying circuit receiving said output signal from said output terminal means and amplifying a voltage of said output signal, and wherein said output voltage amplifying circuit comprises a third transistor means of a second conductivity type being opposite to the first conductivity type of said first and second transistors, and having a control electrode operatively connected to said output terminal means, for controlling said third transistor means in accordance with receiving said output signal; and fourth transistor means, having a third mutual conductance less than said first mutual conductance, and having a control electrode operatively connected to the control electrode of said first transistor means for controlling said fourth transistor means in accordance with receiving the first one of said differential input signals, said fourth transistor means having a first electrode operatively connected to the first electrode of said second transistor means, and having a second electrode operatively connected to the second electrode of said first transistor means, said fourth transistor means continuously providing a current through said first load element and preventing said third transistor means from being cut off when a current flowing through said first transistor means is greater than a current flowing through said second transistor means; and constant current source means, operatively connected to the second electrode of said first transistor means and operatively connectable to receive said second power supply voltage, for providing a constant current to said differential amplifier circuit.

2. A differential amplifier circuit according to claim 1 further comprising:

a second load element operatively connected to the first electrode of said first transistor means, and operatively connectable to receive said first power supply voltage; and fifth transistor means, having a fourth mutual conductance less than said second mutual conductance and having a control electrode operatively connected to the control electrode of said second transistor means for controlling said fifth transistor means in accordance with receiving the second one of said differential input signals, said fifth transistor means having a first electrode operatively connected to the first electrode of said first transistor means and having a second electrode operatively connected to the second electrode of said second transistor means, said fifth transistor means continuously providing a current through said second load element.

3. A differential amplifier circuit according to claim 2, wherein said first load element and said second load element comprise a sixth transistor means and a seventh transistor means respectively, each for providing a load, said sixth and seventh transistor means comprising a current mirror circuit.

4. A differential amplifier circuit according to claim 3, wherein each of said first, second, third, fourth, fifth, sixth and seventh transistor means comprises a metal oxide semiconductor transistor.

5. A differential amplifier circuit according to claim 4, wherein each of said first, second, fourth and fifth transistor means comprises an n-channel type metal oxide semiconductor transistor, and wherein each of said third, sixth and seventh transistor means comprises a p-channel type metal oxide semiconductor transistor.

6. A differential amplifier circuit according to claim 3, wherein each of said first, second, third, fourth, fifth, sixth and seventh transistor means comprises a bipolar transistor.

7. A differential amplifier circuit according to claim 6, wherein each of said first, second, fourth and fifth transistor means comprises an n-p-n type bipolar transistor, and wherein each of said third, sixth and seventh transistor means comprises a p-n-p type bipolar transistor.

8. A differential amplifier circuit according to claim 2, wherein the ratio of the mutual conductance of said fifth transistor means to the mutual conductance of said second transistor means is from one tenth to one fifth.

9. A differential amplifier circuit according to claim 1, wherein the ratio of the mutual conductance of said fourth transistor means to the mutual conductance of said first transistor means is from one tenth to one fifth.

10. A differential amplifier operatively connectable to receive first and second power supply voltages and to receive differential input signals, and for producing an output signal in response to receiving said differential input signals, said differential amplifier circuit comprising:

first input terminal means for receiving a first one of said differential input signals;

second input terminal means for receiving a second one of said differential input signals;

output terminal means for providing said output signal;

first transistor means of a first conductivity, having a first mutual conductance and having a control electrode operatively connected to said first input terminal means for controlling said first transistor means in accordance with receiving the first one of said differential input signals, said first transistor means having a first electrode operatively connected to receive said first power supply voltage, and having a second electrode;

second transistor means of the first conductivity, having a second mutual conductance and having a control electrode operatively connected to said second input terminal means for controlling said second transistor means in accordance with receiving the second one of said differential input signals, said second transistor means having a first electrode operatively connected to said output terminal means and having a second electrode operatively connected to the second electrode of said first transistor means;

a first load element operatively connectable to receive said first power supply voltage and operatively connected to the first electrode of said second transistor means;

third transistor means of the first conductivity, having a third mutual conductance less than said first mutual conductance, and having a control electrode operatively connected to the control electrode of said first transistor means for controlling said third transistor means in accordance with receiving the first one of said differential input signals, said third transistor means having a first electrode operatively connected to the first electrode of said second transistor means, and having a second electrode operatively connected to the second electrode of said first transistor means, said third transistor means continuously providing a current through said first load element;

fourth transistor means of a second conductivity opposite to the first conductivity of said first, second and third transistor means, having a control electrode connected to said output terminal means, for receiving, amplifying and providing a voltage of said output signal; and constant current source means, operatively connected to the second electrode of said first transistor means and operatively connectable to receive said second power supply voltage, for providing a constant current to said differential amplifier.

11. A differential Amplifier according to claim 10 further comprising:

a second load element operatively connected to the first electrode of said first transistor means, and operatively connectable to receive said first power supply voltage; and fifth transistor means of the first conductivity, having a fourth mutual conductance less than said second mutual conductance and having a control electrode operatively connected to the control electrode of said second transistor means for controlling said fifth transistor means in accordance with receiving the second one of said differential input signals, said fifth transistor means having a first electrode operatively connected to the first electrode of said first transistor means and having a second electrode operatively connected to the second electrode of said second transistor means, said fifth transistor means continuously providing a current through said second load element.

* * * * *

UNITED STATES PATENT AND TRADEMARK OFFICE
CERTIFICATE OF CORRECTION

PATENT NO. : 4,914,400

DATED : April 3, 1990

INVENTOR(S) : Osamu Kobayashi et al.

It is certified that error appears in the above-identified patent and that said Letters Patent is hereby corrected as shown below:

Col. 3, line 10, before "circuit" insert --above--.

Col. 11, line 14, "Amplifiers" s/b --amplifier--.

Signed and Sealed this

Fifth Day of May, 1992

Attest:

DOUGLAS B. COMER

*Attesting Officer*         *Acting Commissioner of Patents and Trademarks*